United States Patent [19]
Waldie et al.

[11] Patent Number: 5,630,215
[45] Date of Patent: May 13, 1997

[54] RADIO HAVING A COMBINED PLL AND AFC LOOP AND METHOD OF OPERATING SAME

[75] Inventors: William T. Waldie, Elgin, Ill.; Joseph P. Heck, Fort Lauderdale, Fla.

[73] Assignee: Motorola, Inc., Schaumburg, Ill.

[21] Appl. No.: 417,189

[22] Filed: Apr. 5, 1995

Related U.S. Application Data

[63] Continuation of Ser. No. 926,727, Aug. 6, 1992, abandoned.

[51] Int. Cl.[6] ............................................. H04B 1/16
[52] U.S. Cl. ........................... 455/192.2; 455/196.1; 455/260; 455/265
[58] Field of Search ..................... 455/182.2, 192.2, 455/260, 265, 255, 256, 257, 258, 76, 183.1, 183.2, 196.1, 75, 259, 208, 263, 192.1, 182.1; 375/344, 376

[56] References Cited

U.S. PATENT DOCUMENTS

| | | | |
|---|---|---|---|
| 4,542,533 | 9/1985 | Parker | 455/182.2 |
| 4,703,520 | 10/1987 | Rozanski, Jr. et al. | |
| 4,709,406 | 11/1987 | Omoto | 455/182.2 |
| 5,079,526 | 1/1992 | Heck | |
| 5,335,364 | 8/1994 | Heinonen | 455/76 |

FOREIGN PATENT DOCUMENTS

| | | | |
|---|---|---|---|
| 0439326 | 7/1991 | European Pat. Off. | 455/75 |
| 0214637 | 10/1985 | Japan | 455/255 |
| 0228818 | 9/1988 | Japan | 455/182.2 |
| 0001606 | 1/1990 | Japan | 455/182.2 |

Primary Examiner—Reinhard J. Eisenzopf
Assistant Examiner—Nguyen Vo
Attorney, Agent, or Firm—Kevin D. Kaschke

[57] ABSTRACT

A radio (100) has a combined phase locked loop (PLL) (207) and an automatic frequency control (AFC) loop (215, 109, 111) and a method of operating the same. A mixer (201) converts the received RF signal (117) to an intermediate frequency (IF) signal (219) responsive to an injection signal (217). The PLL (207) locks the injection signal (217) to the received RF signal (117) responsive to a difference between the IF signal (219) and a reference signal (119). The AFC loop (215, 109, 111) locks the reference signal (119) to the received RF signal (117) responsive to a difference between the injection signal (217) and the reference signal (119).

31 Claims, 3 Drawing Sheets

RADIO HAVING A COMBINED PLL AND AFC LOOP AND METHOD OF OPERATING SAME

This is a continuation of application Ser. No. 07/926,727, filed Aug. 6, 1992 and now abandoned.

FIELD OF THE INVENTION

The present invention relates generally to radio communications, and more particularly to a radio having a combined phase locked loop and an automatic frequency control loop and method of operating the same.

BACKGROUND OF THE INVENTION

A radio transceiver has an ability to both receive and transmit information modulated on a carrier frequency. In general, to provide satisfactory performance, the carrier frequency must be predetermined. In many radios, the carrier frequency used for transmission may be identical to, or may otherwise be a function of, the carrier frequency used for reception.

During reception, a radio can ordinarily compensate for various internal frequency errors (caused, for instance, by component tolerances, age, or temperature) by use of various prior art frequency steering or locking techniques. In general, a receiving radio utilizes a steering mechanism, such as an automatic frequency control (AFC) loop, to locate the general vicinity of the carrier frequency it seeks to receive or a locking mechanism, such as a phase locked loop, to precisely locate the reception frequency.

During transmission, however, different circumstances prevail. The carrier frequency transmitted by radio must be as precise as possible. In a base station radio, this can be accomplished in many ways, including the use of high tolerance (and expensive) components, redundant (and expensive) calibrating and monitoring circuits, and the like. In a mobile radio transceiver, however, where space and cost parameters are very important to the end user, such remedies are often not available. Therefore, the problems of maintaining a correct transmission frequency are greater.

In wideband systems, generally available components can be, and are, used in today's mobile radios with reasonable success with regards to accuracy of transmission frequency. Though not as accurate as a base station transmission, the width of the channel spacing provided enough latitude to ensure reasonable performance. However, in narrowband systems, the importance of locating the reception frequency and maintaining the correct transmission frequency has increased.

Therefore, there exists a need in narrowband systems for a better means of locating reception frequencies and providing accurate transmission frequencies in a mobile radio. The desired mechanism should not contribute unduly to the expense of the radio nor its complexity of operation. Further, the desired mechanism should not greatly impair the manufacturing process or serviceability of the radio.

DETAILED DESCRIPTION OF A PREFERRED EMBODIMENT

Figure 1:
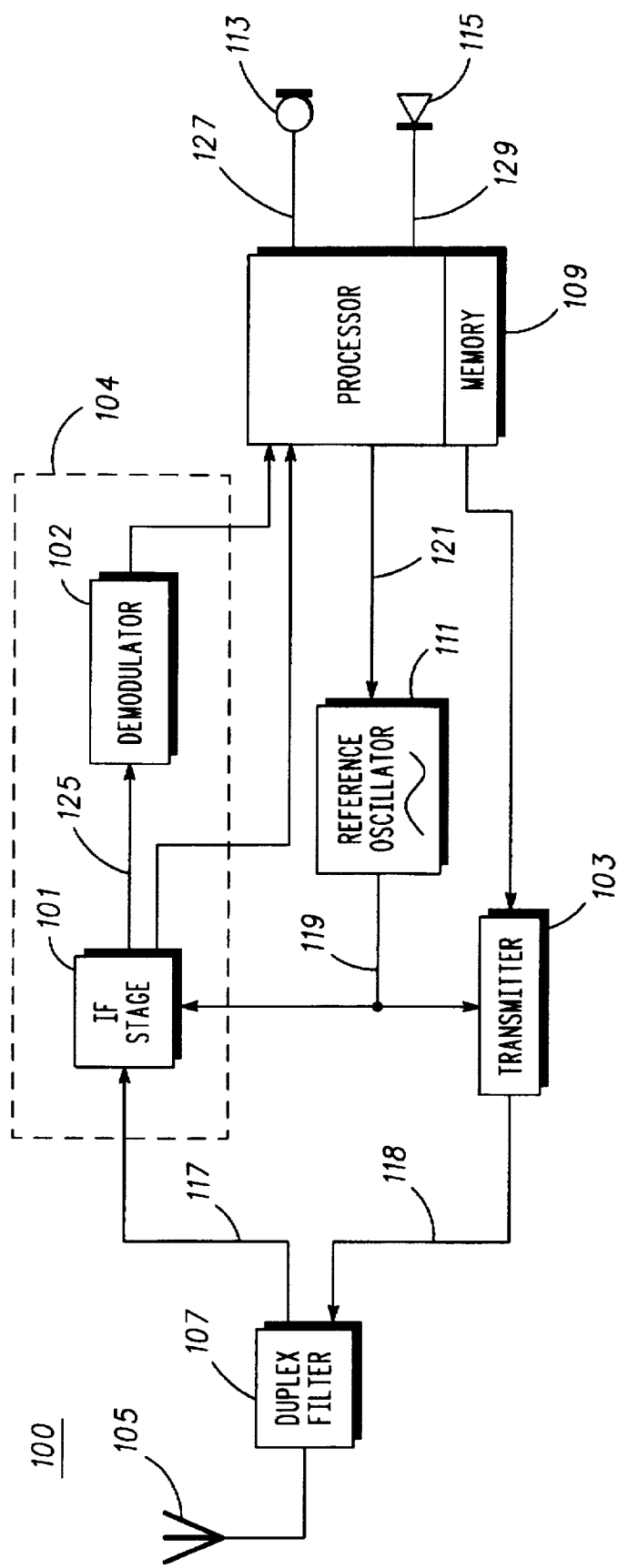
FIG. 1 comprises a block diagram of a radio constructed in accordance with the present invention.

Referring now to the drawings, FIG. 1 comprises a block diagram of a radio 100, such as a cellular radio transceiver, constructed in accordance with the present invention. The radio 100 generally comprises a receiver 104 (including an intermediate frequency (IF) stage 101 and a demodulator 102), a transmitter 103, an antenna 105, a duplex filter 107, a processor with associated memory 109, a reference oscillator 111, an input device, such as a microphone 113, and an output device, such as a speaker 115. Such generally referred to components are well understood in the art, and hence no additional description need be provided here except as may be necessary to indicate interaction between these typical components of a radio transceiver and the preferred embodiment of the present invention.

With continued reference to FIG. 1, radio frequency (RF) signals received by the antenna 105 are passed through the duplex filter 107 to selectively permit passage of only those RF signals of interest to the receiver 104. The received RF signal of interest, if any, at line 117 comprises received information modulated on a carrier frequency. The transmitter 103 transmits RF signals, comprising transmit information modulated on a carrier frequency at line 118, from the antenna 105 as selectively permitted by the duplex filter 107.

The intermediate frequency (IF) stage 101 converts the RF signal at line 117 to a received IF signal at line 125 having an IF carrier frequency typically lower than the received RF carrier frequency. The demodulator 102 recovers information modulated on the IF carrier frequency at line 125 and further processes the recovered information in the processor 109 to provide an electrical output signal at line 129 for conversion to an acoustic output for a user by the speaker 115. The microphone 113 converts acoustic input from the user into an electrical input signal at line 127 for processing by the processor 109 and further transmission by the transmitter 103.

In general, the reference oscillator 111 provides a reference signal at line 119 to the IF stage 101 for receiving purposes and the transmitter 103 for transmission purposes. The frequency of the received RF signal at line 117 and the transmitted RF signal at line 118 are typically a function of the reference signal at line 119. Further, the carrier frequency used for transmission may be identical to, or may otherwise be a function of, the carrier frequency used for reception. Scaling the reference signal, through the use of dividers and the like, for use in specific portions of the radio 100, such as the receiver 104 and transmitter 103 are well known in the art and hence are not shown here.

Figure 3:
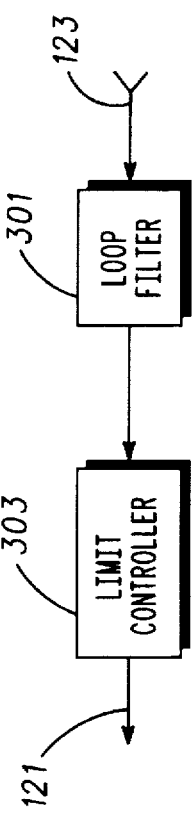
FIG. 3 comprises a partial block diagram of an alternate construction of the radio in FIG. 1.

The reference oscillator 111 may be conventionally implemented in the radio 100 in a closed loop configuration as well understood in the prior art. The use of analog to digital or digital to analog converters, where appropriate, is well understood in the art to provide a compatible interface between coupled components. In the closed loop configuration, shown in FIG. 1, the processor 109 adaptively controls the reference oscillator 111 via a control signal at line 121 responsive to an error signal at line 123 from the IF stage 101. In an alternate closed loop configuration, represented in FIG. 3, the error signal at line 123 from the IF stage 101 is alternatively coupled to a loop filter 301 serially coupled to a limit controller 303 to produce the control signal at line 121.

Figure 2:
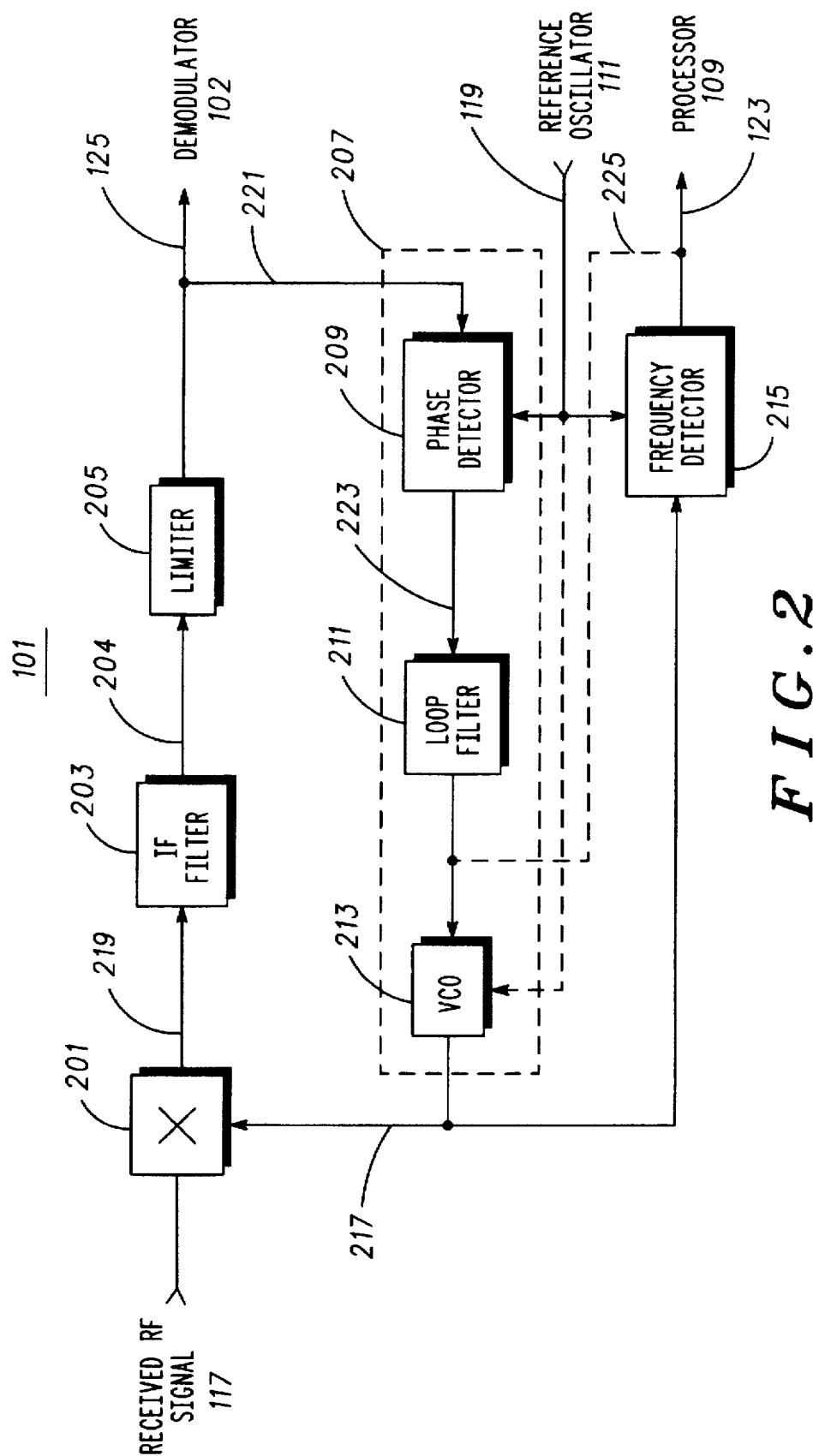
FIG. 2 comprises a block diagram of an intermediate frequency stage of the radio of FIG. 1 constructed in accordance with the present invention.

Referring now to FIG. 2, there is shown a block diagram of the IF stage 101 of the radio in FIG. 1 constructed in accordance with the present invention. The IF stage 101 uniquely comprises a mixer 201, an IF filter 203, a limiter 205, a phase locked loop 207 (including a phase detector 209, a loop filter 211 and a voltage controlled oscillator (VCO) 213) and a frequency detector 215. Such generally referred to components are individually well understood in the art, and hence no additional description need be provided here except as may be necessary to indicate interaction between these typical components of a radio transceiver and the preferred embodiment of the present invention.

The mixer 201 converts the received RF signal of interest at line 117 to an IF signal at line 219 responsive to an injection signal at line 217 from the VCO 213. Additional mixers may be used as needed, per well known prior art techniques, to produce the desired IF signal. The IF signal at line 219 passes through the IF filter 203 to produce a filtered IF signal at line 204 and then through the limiter 205 to produce a limited IF signal at line 221 before being coupled to the demodulator 102 of FIG. 1 and the phase detector 209. The phase detector 209 compares the limited IF signal at line 221 and the reference signal at line 119 to produce a phase error signal at line 223. The phase error signal passes through the loop filter 211 to produce a voltage based filtered phase error signal at line 225. The VCO generates the frequency based injection signal at line 217 responsive to the filtered phase error signal. The error in the phase error signal at line 225 is the same error as the error in the injection signal at line 217. The primary difference in the error is that the phase error signal at line 225 is a voltage signal and the injection signal at line 217 is a frequency signal.

Depending on the type of tolerance of the VCO 213 used, the VCO 213 may also be responsive to the reference signal at dotted line 119 using conventional design practices.

The interaction between the mixer 201, the IF filter 203, the limiter 205 and the phase locked loop 207 operate in accordance with well understood prior art technique. Namely, the mixer 201 converts the received RF signal at line 117 to the IF signal at line 219. The PLL 207 locks the injection signal at line 217 to the received RF signal at line 117 responsive to the reference signal at line 119. The PLL 207 stabilizes the IF signal (i.e. keeps the carrier frequency of the IF signal constant). The receiver 104 need only start in the general vicinity of the signal it seeks to receive and the PLL 207 precisely locates the reception signal. Hence, the PLL compensates for frequency errors primarily induced by the reference oscillator 111. Other means for stabilizing the IF carrier frequency may be used without deviating from the scope of the present invention.

A problem arises in narrowband systems, however, when the frequency errors produced by the reference oscillator 111 are too great for the PLL 207 to precisely locate the reception frequency or to provide the correct transmission frequency. The present invention solves this problem by integrating a frequency steering mechanism, such as an automatic frequency control (AFC) loop (including the frequency detector 215, the processor 109 and the reference oscillator 111), with the PLL 207. In general, the frequency detector 215 compares the injection signal at line 217 and reference signal at line 119 to produce a frequency error signal at line 123. The processor 109 receives and processes the frequency error signal at line 123 to produce the control signal at line 121 providing adaptive control of the reference oscillator 111. The processor 109 includes a filter (now shown) for filtering the frequency error signal to produce a filtered error signal; and a limit controller (now shown) for limiting the filtered error signal to produce the control signal at line 121. Any errors (due to tolerances, aging or temperature) produced by the reference oscillator 111 are compensated for using the AFC loop. Thus, the adaptive reference oscillator 111 provides a corrected reference signal at line 119 for use by the PLL 207 to more precisely locate the IF signal at line 219 and to provide a more precise transmission carrier frequency.

Alternatively, the processor may receive and process the voltage based filtered phase error signal at line 225 produced by the loop filter 211 instead of the frequency error signal at line 123 from the frequency detector 215. In this case, the processor 109 stores in associated memory the reference signal. The reference signal comprises such variables such as the reference oscillator's 111 known tolerance and predicted response to aging and temperature. The voltage based error signal at line 225 is compared to the reference signal stored in memory to produce the control signal at line 121. Although the alternate configuration using the voltage based filtered phase error signal at line 225 may, under some circumstances, be more cumbersome to implement than the configuration using the frequency based injection signal at line 123, the end result is the same. The end result being that the PLL 207 locks the received RF signal at line 117 to the injection signal 217 responsive to the reference signal at line 119 and the AFC loop locks the reference signal at line 119 to the received RF signal responsive to the injection signal at line 217.

The AFC loop constructed in accordance with the present invention is different from conventional AFC loops. Conventional AFC loops derive the input to the AFC loop from error in the received IF signal. In accordance with the present invention, the input to the AFC loop is derived from the phase error signal at line 223 since error in the received IF signal at line 219 has been removed by the PLL 207. The AFC loop is fed by either the voltage based filtered phase error signal at line 225 or the frequency based injection signal at line 217 so that errors induced by the reference oscillator 111 in the PLL 207 are compensated for. The PLL 207 and the AFC loop operate simultaneously. The PLL 207 removes error in the received IF signal induced by the reference oscillator 111. The AFC loop removes error due to the reference oscillator 111 due to its own tolerances, aging, temperature characteristics and the like. The reference oscillator 111 is adjusted, for example, for transmission purposes to maintain an accurate transmit frequency and for reception purposes to compensate for aging of the reference oscillator 111.

In accordance with well understood prior art technique, the VCO 213 has a frequency appropriate for locking the receiver 104 to the desired IF signal. The VCO 213 is conventionally known as a local oscillator but may include other elements when considered as a whole with the local oscillator is known as a frequency synthesizer. An example of a particular frequency synthesizer which may be used to fulfill the requirements of the VCO 213 in the preferred embodiment of the present invention is described in detail in U.S. Pat. No. 5,079,526 herein incorporated by reference. The frequency synthesizer described therein produces direct frequency modulation (i.e. frequency modulation which may include a shift from the center frequency of the IF filter 203 by a fixed frequency) without the need for DC frequency modulating the reference oscillator. Thus, when this particular embodiment of the frequency synthesizer is used in combination with the present invention, the PLL 207 phase locks to the IF signal offset from the center of the IF filter 203 while the AFC loop adapts the reference oscillator 111 to provide the reference signal at line 119 for the PLL 207.

Since phase locking occurs simultaneously with frequency locking, the frequency deviation at the input to a conventional divider (not shown) in the frequency detector 215 is reduced. Therefore, a smaller divide by ratio is used in the present invention. A smaller divide ratio advantageously causes the receiver to adapt to changes in the received signal more quickly.

The IF stage 101 of FIG. 2 may also be implemented in a conventional simplex radio as well as the duplex radio as shown in FIG. 1. In a simplex radio the reference signal produced from the last received signal is stored for use with the next transmitted signal.

Figure 4:
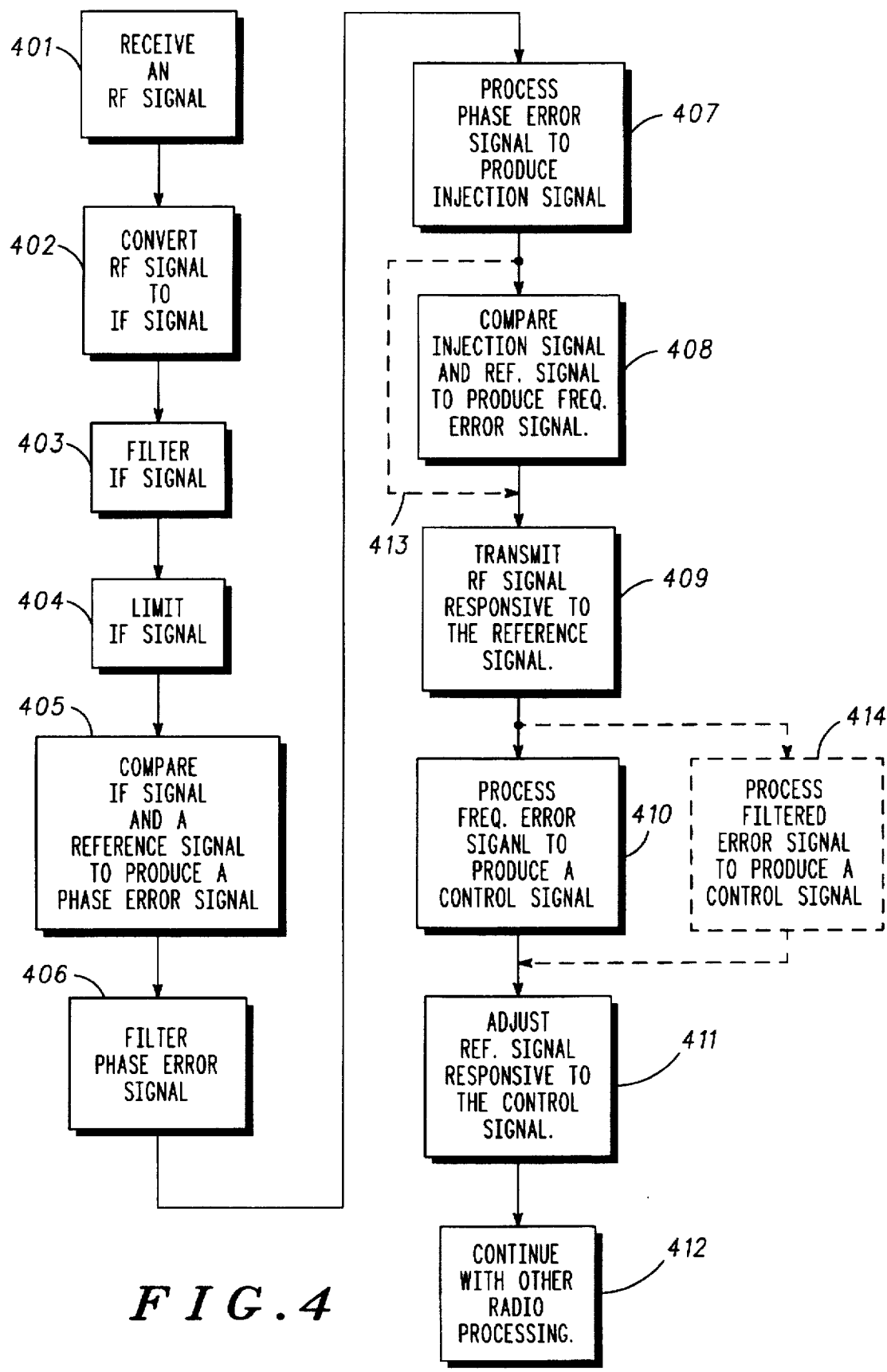
FIG. 4 is a flow diagram outlining the steps in a method of operating of a radio constructed in accordance with the present invention.

Now referring to FIG. 4, there is shown a flow diagram outlining the steps in a method of operating of a radio 100 constructed in accordance with the present invention.

Blocks 401–408 comprise steps of operating the IF stage 101. At block 401 the radio 100 receives a RF signal 117 of interest, if any. At block 402 the received RF signal 117 is converted to an IF signal 219 responsive to an injection signal 217. At block 403 the IF signal 219 is filtered by IF filter 203 to produce a filtered IF signal 204. At block 404 the filtered IF signal 204 is limited by limiter 205 to produce a limited IF signal 125.

Blocks 405–407 comprise stops of operating the PLL 207. At block 405 the limited IF signal 125 and a reference signal 119 are compared by phase detector means 209 to produce a phase error signal 223. At block 406 the phase error signal 223 is filtered by loop filter 211 to produce a filtered phase error signal 225. At block 407 the injection signal at line 217 is generated responsive to the filtered phase error signal 225.

Block 408 comprises an integral portion of the AFC loop. At block 408 the injection signal 217 and the reference signal 119 are compared to produce a frequency error signal 123.

At block 409 an RF the signal 118 is transmitted responsive to the reference signal 119.

At block 410 the frequency error signal 123 is processed by processor 109 to produce a control signal 121. At block 411 the reference signal 119 is adjusted responsive to the control signal 121.

At block 412 the radio 100 continues with other processing.

Path 413 and block 414 designate an alternate flow for operating the radio 100 in accordance with the present invention. Path 413 bypasses block 408 and block 414 is substituted for block 410. Therefore, the control signal 121 is produced responsive to a filtered error signal at block 414 processed by processor 109 rather than responsive to the frequency error signal 123 generated at block 408.

Hence, a PLL 207, locks the injection signal at line 217 to the received RF signal at line 117 responsive to the reference signal at line 119 and the AFC loop 215, 109, 111 locks the reference signal to the received RF signal responsive to the injection signal at line 217. In a mobile radio operating in a narrow band system, reception frequencies are precisely located and transmission frequencies are accurately produced. The adaptive reference oscillator 111 is fed by either a filtered phase error signal at line 225 or the injection signal at line 217 is incorporated into the radio 100 in either an open or a closed loop configuration.

We claim:

1. A radio comprising:
   means for converting a received radio frequency (RF) signal of interest, if any, to an intermediate frequency (IF) signal responsive to an injection signal;
   first means for locking the injection signal to the received RF signal responsive to a difference between the IF signal and a reference signal to precisely locate the received RF signal; and
   second means for locking the reference signal to the received RF signal responsive to a difference between the injection signal and the reference signal to generally locate the received RF signal,
   wherein the first means for locking and the second means for locking operate simultaneously.

2. A radio in accordance with claim 1 wherein the first and second means for locking each lock to the received RF signal responsive to either phase or frequency characteristics of the received RF signal.

3. A radio in accordance with claim 1 wherein the first means for locking further comprises:
   phase detecting means for comparing the IF signal and the reference signal to produce a phase error signal;
   means for filtering the phase error signal to produce a filtered phase error signal; and
   means for generating the injection signal responsive to the filtered phase error signal.

4. A radio in accordance with claim 3 wherein the second means for locking further comprises:
   means for processing the filtered phase error signal to produce a control signal; and
   adaptive reference signal source means for providing the reference signal responsive to the control signal.

5. A radio in accordance with claim 4 wherein the means for processing includes associated memory for storing the reference signal, the means for processing further comprises means for comparing the filtered phase error and the stored reference signal to produce the control signal.

6. A radio in accordance with claim 1 wherein the injection signal has a predetermined fixed frequency offset.

7. A radio in accordance with claim 1 wherein the second means for locking further comprises:
   frequency detecting means for comparing the injection signal and the reference signal to produce a frequency error signal;
   means for processing the frequency error signal to produce a control signal; and
   adaptive reference signal source means for providing the reference signal responsive to the control signal.

8. A radio in accordance with claim 7 wherein the means for processing further comprises:
   means for filtering the frequency error signal to produce a filtered error signal; and
   limit control means for limiting the filtered error signal to produce the control signal.

9. A radio in accordance with claim 7 wherein the means for processing further comprises a digital signal processor.

10. A radio in accordance with claim 1 further comprising means for filtering the IF signal.

11. A radio in accordance with claim 1 further comprising means for limiting the IF signal.

12. A radio in accordance with claim 1 further comprising means for transmitting a radio frequency signal responsive to the reference signal.

13. An intermediate frequency stage of a radio frequency receiver comprising:

means for converting a received radio frequency (RF) signal of interest, if any, to an intermediate frequency (IF) signal responsive to an injection signal;

first means for filtering the IF signal to produce a filtered IF signal;

means for limiting the filtered IF signal to produce a limited IF signal;

phase detecting means for comparing the limited IF signal and a reference signal to produce a phase error signal;

second means for filtering the phase error signal to produce a filtered phase error signal;

means for generating the injection signal responsive to the filtered phase error signal to precisely locate the received RF signal;

frequency detecting means for comparing the injection signal and the reference signal to produce a frequency error signal; and reference signal source means for generating the reference signal responsive to the frequency error signal to generally locate the received RF signal, wherein the phase detecting means, the second means for filtering, the means for generating the frequency detecting means and the reference signal source means operate simultaneously.

14. A radio comprising:

reception means comprising:

means for converting a received radio frequency (RF) signal of interest, if any, to an intermediate frequency (IF) signal responsive to an injection signal;

first means for filtering the IF signal to produce a filtered IF signal;

means for limiting the filtered IF signal to produce a limited IF signal;

phase detecting means for comparing the limited IF signal and a reference signal to produce a phase error signal;

second means for filtering the phase error signal to produce a filtered phase error signal;

means for generating the injection signal responsive to the filtered phase error signal to precisely locate the received RF signal;

frequency detecting means for comparing the injection signal and the reference signal to produce a frequency error signal;

transmission means for transmitting an RF signal responsive to the reference signal;

means for processing the frequency error signal to produce a control signal; and adaptive reference signal source means for providing the reference signal responsive to the control signal to generally locate the received RF signal, wherein the phase detecting means, the second means for filtering, the means for generating the frequency detecting means, the means for processing and the adaptive reference signal source means operate simultaneously.

15. A radio having a phase locked loop for producing an injection signal responsive to an IF signal and a reference signal, the radio comprising:

phase detecting means for comparing the IF signal and the reference signal to produce a phase error signal;

means for filtering the phase error signal to produce a filtered phase error signal;

means for generating the injection signal responsive to the filtered phase error signal to precisely locate the received RF signal;

frequency detecting means for comparing the injection signal and the reference signal to produce a frequency error signal;

means for processing the frequency error signal to produce a control signal; and adaptive reference signal source means for providing the reference signal responsive to the control sign to generally locate the received RF signal;

wherein the phase detecting means, the means for fitting, the means for generating the frequency detecting means, the means for processing and the adaptive reference signal source means operate simultaneously.

16. A method of operating a radio comprising the steps of:

converting a received radio frequency (RF) signal of interest, if any, to an intermediate frequency (IF) signal responsive to an injection signal;

locking the injection signal to the received RF signal responsive to a difference between the IF signal and a reference signal to precisely locate the received RF signal; and locking the reference signal to the received RF signal responsive to a difference between the injection signal and the reference signal to generally locate the received RF signal;

wherein the step of locking the injection signal to the received RF signal and the step of locking the reference signal to the received RF signal operate simultaneously.

17. A method of operating a radio in accordance with claim 16 wherein both steps of locking each lock to the received RF signal responsive to either phase or frequency characteristics of the received RF signal.

18. A method of operating a radio in accordance with claim 16 wherein the step of locking the injection signal further comprises the steps of:

comparing the IF signal and the reference signal to produce a phase error signal;

filtering the phase error signal to produce a filtered phase error signal; and generating the injection signal responsive to the filtered phase error signal.

19. A method of operating a radio in accordance with claim 18 wherein the step of locking the reference signal further comprises the steps of:

processing the filtered phase error signal to produce a control signal; and adjusting the reference signal responsive to the control signal.

20. A method of operating a radio in accordance with claim 19 wherein the step of processing further comprises the step of comparing the filtered phase error signal and a stored reference signal to produce the control signal.

21. A method of operating a radio in accordance with claim 16 wherein the injection signal has a predetermined fixed frequency offset.

22. A method of operating a radio in accordance with claim 16 wherein the step of locking the reference signal further comprises the steps of:

comparing the injection signal and the reference signal to produce a frequency error signal;

processing the frequency error signal to produce a control signal; and adjusting the reference signal responsive to the control signal.

23. A method of operating a radio in accordance with claim 22 wherein the step of processing further comprises the steps of:

filtering the frequency error signal to produce a filtered error signal; and limiting the filtered error signal to produce the control signal.

24. A method of operating a radio in accordance with claim 22 wherein the step of processing further comprises digitizing the frequency error signal.

25. A method of operating a radio in accordance with claim 16 further comprising the step of filtering the IF signal.

26. A method of operating a radio in accordance with claim 16 further comprising the step of limiting the IF signal.

27. A method of operating a radio in accordance with claim 16 further comprising the step of transmitting a radio frequency signal responsive to the reference signal.

28. A method of operating an intermediate frequency stage of a radio frequency receiver comprising the steps of:

converting a received radio frequency (RF) signal of interest, if any, to an intermediate frequency (IF) signal responsive to an injection signal;

filtering the IF signal to produce a filtered IF signal;

limiting the filtered IF signal to produce a limited IF signal;

comparing the limited IF signal and a reference signal to produce a phase error signal;

filtering the phase error signal to produce a filtered phase error signal;

generating the injection signal responsive to the filtered phase error signal to precisely locate the received RF signal;

comparing the injection signal and the reference signal to produce a frequency error signal; and generating the reference signal responsive to the frequency error signal to generally locate the received RF signal, wherein the steps of comparing the limited RF signal and a reference signal, filtering the phase error signal, generating the injection signal comparing the injection signal and the reference signal and generating the reference signal operate simultaneously.

29. A method of operating a radio comprising the steps of:

receiving a radio frequency (RF) signal of interest, if any, the step of receiving further comprising the steps of:

converting the received RF signal to an intermediate frequency (IF) signal responsive to an injection signal;

filtering the IF signal to produce a filtered IF signal;

limiting the filtered IF signal to produce a limited IF signal;

comparing the limited IF signal and a reference signal to produce a phase error signal;

filtering the phase error signal to produce a filtered phase error signal;

generating the injection signal responsive to the filtered phase error signal to precisely locate the received RF signal; and comparing the injection signal and the reference signal to produce a frequency error signal;

transmitting an RF signal responsive to the reference signal;

processing the frequency error signal to produce a control signal; and adjusting the reference signal responsive to the control signal to generally locate the received RF signal, wherein the steps of comparing the limited IF signal and a reference signal, filtering the phase error signal, generating the injection signal, comparing the injection signal and the reference signal, processing the frequency error signal and adjusting the reference signal operate simultaneously.

30. A method of operating a radio having a phase locked loop for producing an injection signal responsive to an IF signal and a reference signal, the method comprising the steps of:

comparing the IF signal and the reference signal to produce a phase error signal;

filtering the phase error signal to produce a filtered phase error signal;

generating the injection signal responsive to the filtered phase error signal to precisely locate the received RF signal;

comparing the injection signal and the reference signal to produce a frequency error signal;

processing the frequency error signal to produce a control signal; and adjusting the reference signal responsive to the control signal to generally locate the received RF signal, wherein the steps of comparing the IF signal and the reference signal, filtering the phase error signal, generating the injection signal, comparing the injection signal and the reference signal, processing the frequency error signal and adjusting the reference signal operate simultaneously.

31. A radiotelephone comprising:

a mixer for converting a received radio frequency (RF) signal to an intermediate frequency (IF) signal responsive to an injection signal;

a phase locked loop for locking the injection signal to the received RF signal responsive to a difference between the IF signal and a reference signal to precisely locate the received RF signal; and an automatic frequency controller for locking the reference signal to the received RF signal responsive to a difference between the injection signal and the reference signal to generally locate the received RF signal, wherein the phase locked loop and the automatic frequency controller operate simultaneously.

* * * * *

UNITED STATES PATENT AND TRADEMARK OFFICE
CERTIFICATE OF CORRECTION

PATENT NO. : 5,630,215
DATED : May 13, 1997
INVENTOR(S) : Waldie et al.

It is certified that error appears in the above-indentified patent and that said Letters Patent is hereby corrected as shown below:

Claim 15

In line 19, please replace "fitting" with --filtering--.

Claim 28

In line 21, please replace "RF" with --IF--.

Signed and Sealed this

Seventh Day of October, 1997

Attest:

BRUCE LEHMAN

Attesting Officer

Commissioner of Patents and Trademarks